(12) United States Patent
Edwards et al.

(10) Patent No.: US 9,408,335 B2
(45) Date of Patent: Aug. 2, 2016

(54) ICM OPTIMIZATION AND STANDARDIZATION FOR AUTOMATION

(71) Applicant: Cisco Technology, Inc., San Jose, CA (US)

(72) Inventors: William Frank Edwards, Livermore, CA (US); George Edward Curtis, San Jose, CA (US); Ki Yuen Chau, Palo Alto, CA (US); Sandeep A. Patel, Los Gatos, CA (US); Keith Frank Tharp, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 207 days.

(21) Appl. No.: 13/930,570

(22) Filed: Jun. 28, 2013

(65) Prior Publication Data

US 2015/0003032 A1    Jan. 1, 2015

(51) Int. Cl.
| | |
|---|---|
| *H05K 9/00* | (2006.01) |
| *H01R 13/719* | (2011.01) |
| *H01R 13/66* | (2006.01) |
| *H01R 12/72* | (2011.01) |
| *H01R 24/64* | (2011.01) |

(52) U.S. Cl.
CPC .......... *H05K 9/0052* (2013.01); *H01R 13/6633* (2013.01); *H01R 13/719* (2013.01); *H01R 12/722* (2013.01); *H01R 24/64* (2013.01)

(58) Field of Classification Search
CPC ..... H05K 9/0052; H02J 1/00; H01R 13/6633; H01R 12/722; H01R 13/719; H01R 24/64
USPC ................ 439/541.5, 620.07, 620.18, 607.43
See application file for complete search history.

(56) References Cited

U.S. PATENT DOCUMENTS

| | | | |
|---|---|---|---|
| 6,150,896 A | 11/2000 | DeCramer et al. | |
| 6,811,442 B1 * | 11/2004 | Lien et al. | 439/620.07 |
| 6,986,684 B1 * | 1/2006 | Lien | 439/620.07 |
| 7,708,595 B2 * | 5/2010 | Chow et al. | 439/620.15 |
| 7,749,027 B2 * | 7/2010 | Chow et al. | 439/620.15 |
| 8,007,318 B1 * | 8/2011 | Dunwoody | H01R 13/6461 439/607.55 |
| 8,449,332 B2 * | 5/2013 | Purkis et al. | 439/620.18 |
| 2007/0015416 A1 * | 1/2007 | Gutierrez et al. | 439/676 |
| 2007/0192604 A1 * | 8/2007 | Chiasson | G06F 21/6245 713/170 |
| 2008/0200060 A1 * | 8/2008 | Buckmeier et al. | 439/417 |
| 2009/0253300 A1 * | 10/2009 | Huang et al. | 439/620.05 |
| 2010/0062645 A1 * | 3/2010 | Chow et al. | 439/620.22 |
| 2011/0028037 A1 * | 2/2011 | Felislda De La Cruz | 439/607.28 |
| 2011/0053418 A1 * | 3/2011 | Margulis et al. | 439/620.07 |
| 2011/0268112 A1 * | 11/2011 | Slepov | H01R 24/64 370/389 |
| 2012/0113602 A1 * | 5/2012 | Zhang et al. | 361/748 |
| 2012/0142199 A1 | 6/2012 | Purkis et al. | |
| 2012/0176756 A1 * | 7/2012 | Gailus et al. | 361/752 |
| 2012/0315794 A1 * | 12/2012 | Chen et al. | 439/620.07 |
| 2013/0288526 A1 * | 10/2013 | Rascon et al. | 439/607.35 |
| 2014/0197696 A1 * | 7/2014 | Mooney | H01H 9/54 307/112 |
| 2014/0258738 A1 * | 9/2014 | Greenwalt et al. | 713/300 |
| 2015/0305205 A1 * | 10/2015 | Gonzalez | G06F 1/20 361/697 |

OTHER PUBLICATIONS

International Search Report dated Oct. 15, 2014 cited in Application No. PCT/US2014/043895, 9 pgs.

\* cited by examiner

*Primary Examiner* — Hoa C Nguyen
*Assistant Examiner* — Keith Depew
(74) *Attorney, Agent, or Firm* — Merchant & Gould P.C.

(57) ABSTRACT

An apparatus may be provided. The apparatus may comprise a circuit board. In addition, the apparatus may comprise an integrated connector mounted to the circuit board. A choke, external to the integrated connector, may be included in the apparatus. The choke may be electrically connected to the integrated connector through the circuit board.

20 Claims, 6 Drawing Sheets

US 9,408,335 B2

ICM OPTIMIZATION AND STANDARDIZATION FOR AUTOMATION

TECHNICAL FIELD

The present disclosure relates generally to interference prevention.

BACKGROUND

Power Over Ethernet (POE) is a standardized system to provide electrical power along with data on Ethernet cabling. This allows a single cable to provide both data connection and electrical power to such devices as network hubs or closed-circuit TV cameras. Unlike standards such as Universal Serial Bus (USB) that also powers devices over data cables, POE allows long cable lengths.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1:
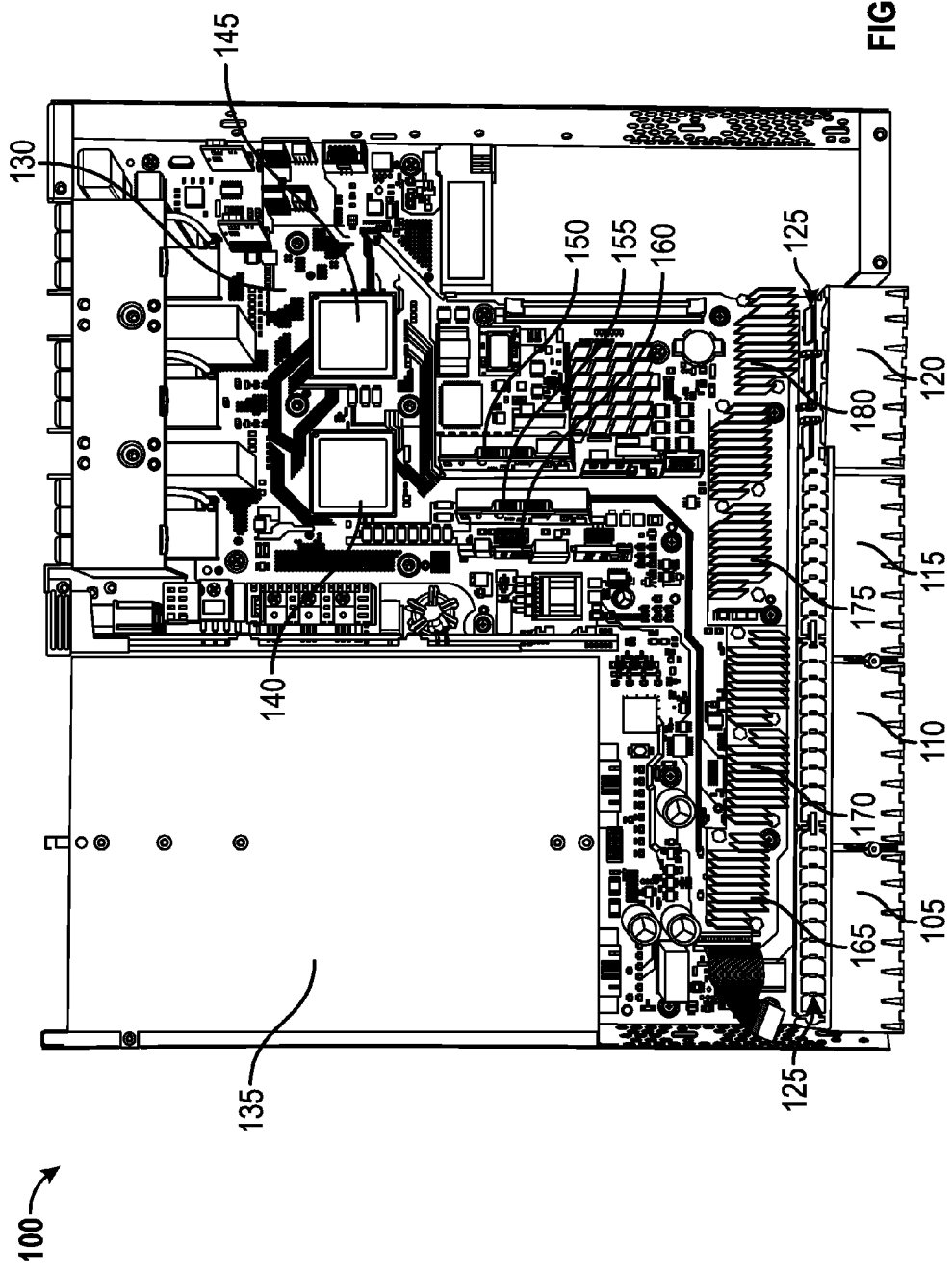
FIG. 1 shows a device.

An apparatus may be provided. The apparatus may comprise a circuit board. In addition, the apparatus may comprise an integrated connector mounted to the circuit board. A choke, external to the integrated connector, may be included in the apparatus. The choke may be electrically connected to the integrated connector through the circuit board.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Integrated connectors may be used to interface a device to the world outside the device. When constructing the device, an Electromagnetic Interference (EMI) containment feature called a "Faraday Cage" may be designed into the device. A Faraday Cage may comprise an enclosure formed by conducting material or by a mesh of conducting material. This enclosure may block external static and non-static electric fields. Consequently, a Faraday Cage may comprise an approximation to an ideal hollow conductor. Externally or internally applied electromagnetic fields produce forces on charge carriers (i.e., electrons) within the ideal hollow conductor. The charges are redistributed accordingly (e.g., electric currents may be generated). Once the charges have been redistributed so as to cancel the applied electromagnetic field inside, the currents stop.

An integrated connector may include at least one transformer and at least one choke. The at least one transformer may be tuned to block ground currents in the device in which the integrated connector is disposed. The ground currents may be blocked in order to mitigate any electrical shock hazards to people who may come into contact with the device. The at least one choke may be tuned to filter noise caused by other components in the device in which the integrated connector is disposed. Because the noise causing components may change as the device's design is developed and refined over the lifecycle of the device, each newly developed and refined device design may have a correspondingly different noise profile. Consequently, each newly developed and refined device design may have correspondingly different choke sizes in order to mitigate the correspondingly different noise profiles.

As the device's design is developed and refined over the lifecycle of the device, the scheme to block ground currents may change little or even stay the same. Consequently, in contrast to the choke sizes, the transformer sizes may remain the same as the device's design is developed and refined over the lifecycle of the device. However, because both the transformer and the choke may be included in the integrated connector, the integrated connector's design may change in order to respond to the changing noise profile that may be caused as the device's design is developed and refined over the lifecycle of the device. As the design changes, however, only the choke size may need to be changed and not the transformer size. Consistent with embodiments of the disclosure, the choke may be removed from the integrated connector and may be electrically connected to the transformer (e.g. in the integrated connector) through a circuit board on which the choke (e.g. external to the integrated connector) and the integrated connector may be disposed.

Consistent with embodiments of the disclosure, as the device's design is developed and refined over the lifecycle of the device, the same integrated connector may be used and only the choke size (e.g. on the circuit board, but external to the integrated connector) may need to be changed. This may result in a cost savings by avoiding a retooling cost for making the integrated connectors because the integrated connector's design may remain unchanged when the device's noise profile changes over the lifecycle of the device. In other words, only the external choke and not the integrated connector may need to be modified as the device is developed over its lifecycle. Also, a cost savings may be realized by connecting the choke and transformer through circuit board traces rather than using labor intensive "pigtail" connections.

FIG. 1 shows a device 100. As shown in FIG. 1, device 100 may comprise a plurality of integrated connectors. The plurality of integrated connectors may comprise a first integrated connector 105, a second integrated connector 110, a third integrated connector 115, and a fourth integrated connector 120. A choke structure space 125 may be provided behind the plurality of integrated connectors. Choke structure space 125 may be anywhere on device 100.

As device 100 is being constructed, the plurality of integrated connectors (e.g., first integrated connector 105, second integrated connector 110, third integrated connector 115, and fourth integrated connector 120) may be installed onto a circuit board 130 from the top and either press fit or soldered in place. Device 100 may further comprise a power supply 135.

A first application-specific integrated circuit (ASIC) 140 and a second ASIC 145 may be disposed on circuit board 130. First ASIC 140 and second ASIC 145 may comprise integrated circuits (ICs) customized for a particular use, rather than intended for general-purpose use. A plurality of direct current (DC)-to-DC converters may be included on circuit board 130. The plurality of DC-to-DC converters may comprise, but are not limited to, a first DC-to-DC converter 150, a second DC-to-DC converter 155, and a third DC-to-DC converter 160.

A plurality of physical layer (PHY) circuits may be disposed on circuit board 130. A PHY circuit may connect a link layer device (e.g. a Media Access Control, or MAC address) to a physical medium such as an optical fiber or copper cable. A PHY circuit may include a Physical Coding Sublayer (PCS) and a Physical Medium Dependent (PMD) layer. The PCS may encode and decode the data that is transmitted and received. The purpose of the encoding may be to make it easier for the receiver to recover the signal.

The plurality of PHY circuits may comprise, but are not limited to, a first PHY circuit 165, a second PHY circuit 170, a third PHY circuit 175, and a fourth PHY circuit 180. First PHY circuit 165 may correspond to first integrated connector 105, second PHY circuit 170 may correspond to second integrated connector 110, third PHY circuit 175 may correspond to third integrated connector 115, and fourth PHY circuit 180 may correspond to fourth integrated connector 120.

Vertical plane members may be placed between the plurality of integrated connectors. The vertical plane members may be electrically connected to a chassis of device 100. Side fingers from the integrated connectors may be in electrical contact with the vertical plane members thus grounding the integrated connectors to the chassis and extending the Faraday Cage. Device 100 may comprise, but is not limited to, a networking device such as a router, a switch, or any type device.

Figure 2:
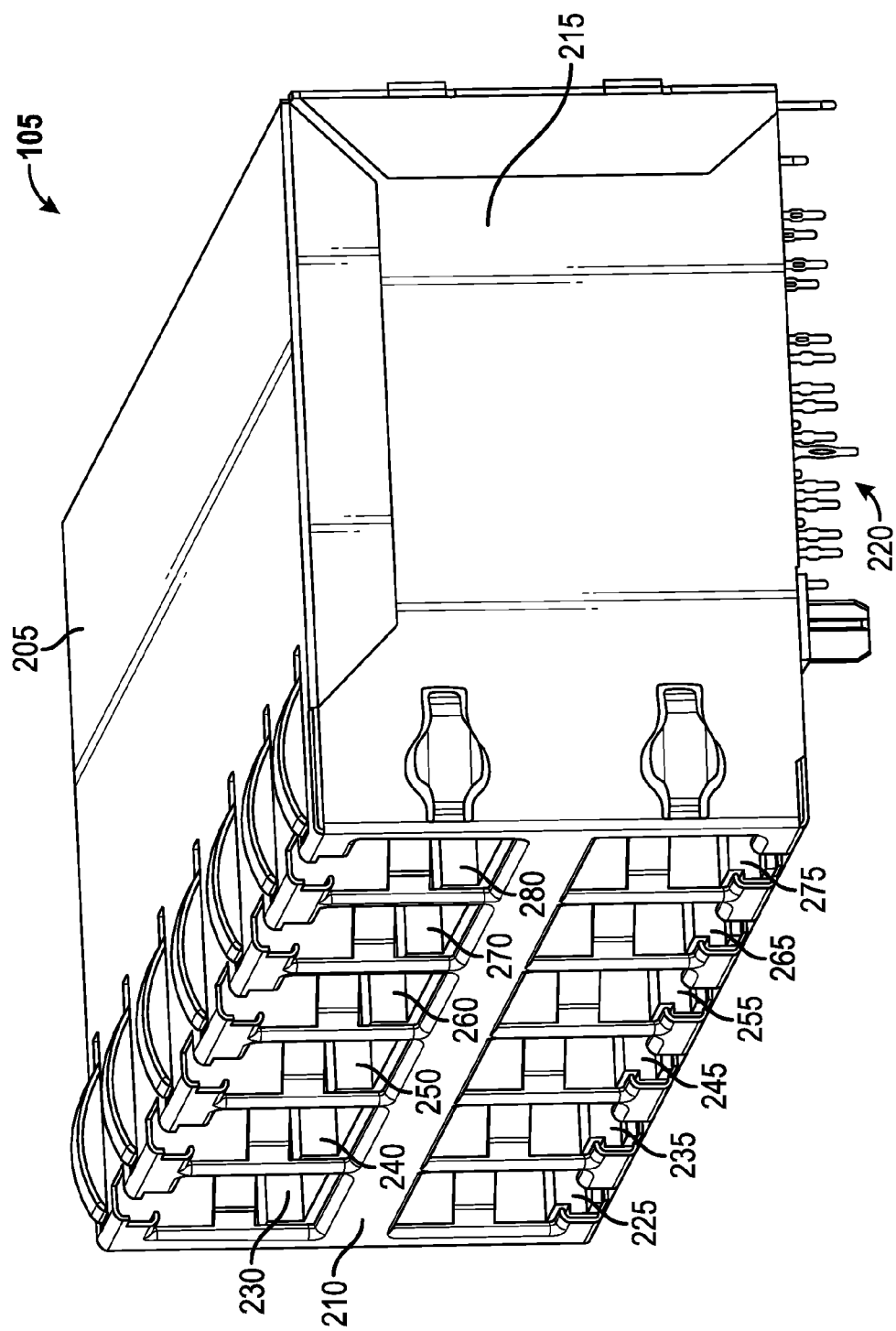
FIG. 2 shows an integrated connector.

FIG. 2 shows first integrated connector 105 in more detail. As shown in FIG. 2, first integrated connector 105 may comprise a top portion 205, a front portion 210, and a side portion 215. Circuit board connectors 220 may also be included on first integrated connector 105. Front portion 210 may comprise a plurality of receptacles. The plurality of receptacles may comprise a first receptacle 225, a second receptacle 230, a third receptacle 235, a fourth receptacle 240, a fifth receptacle 245, a sixth receptacle 250, a seventh receptacle 255, an eighth receptacle 260, a ninth receptacle 265, a tenth receptacle 270, an eleventh receptacle 275, and a twelfth receptacle 280.

During operation of device 100, a plurality of jacks (e.g., RJ-45s) may be plugged into the plurality of receptacle. The plurality of receptacles may respectively connect signal wires from the plurality of jacks to ones of circuit board connectors 220. Circuit board connectors 220 may be soldered or press fit onto circuit board 130.

Figure 3:
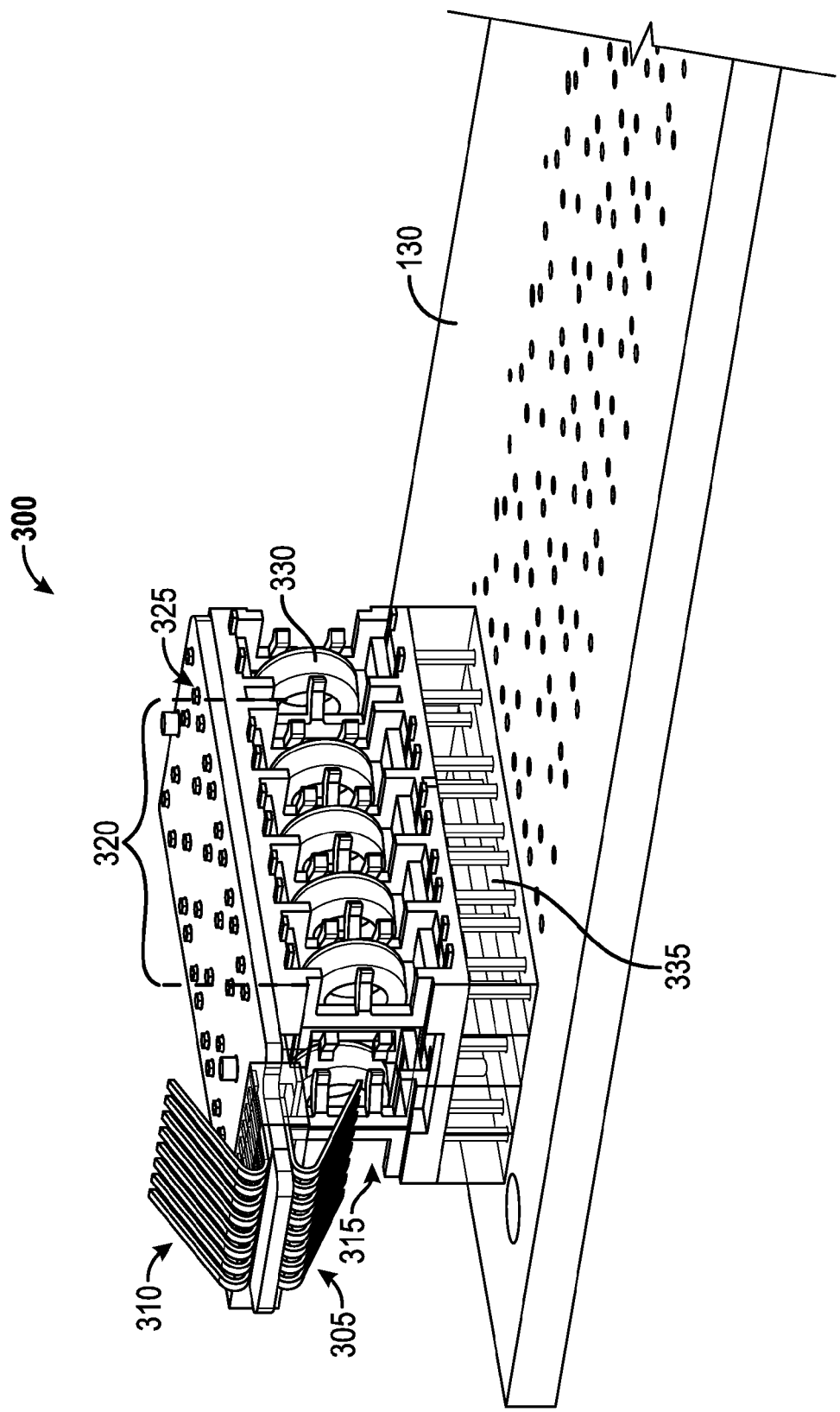
FIG. 3 shows a connector structure.

FIG. 3 shows a connector structure 300. As shown in FIG. 3, connector structure 300 may comprise first leaf connectors 305, second leaf connectors 310, a first plurality of transformers 315, and a second plurality of transformers 320. Connector structure 300 may further include a first Power Over Ethernet (POE) transformer 325, a second POE transformer 330, and a vertical space 335. First leaf connectors 305 may correspond to first receptacle 225 and may connect signal wires from a jack (e.g., RJ-45) plugged into first receptacle 225 with device 100. Similarly, second leaf connectors 310 may correspond to second receptacle 230 and may connect signal wires from a jack (e.g., RJ-45) plugged into second receptacle 230 with device 100.

First plurality of transformers 315 may be configured and tuned to block ground currents corresponding to first receptacle 225. Similarly, second plurality of transformers 320 may be configured and tuned to block ground currents corresponding to second receptacle 230. The ground currents may be blocked in order to mitigate any electrical shock hazards to people who may come into contact with device 100. While first plurality of transformers 315 and second plurality of transformers 320 are shown to respectively include four transformers, they are not so limited and may include any number of transformers. First POE transformer 325 and second POE transformer 330 may respectively provide power over Ethernet to first receptacle 225 and second receptacle 230.

Vertical space 335 may provide a volume where the choke could be located if it were contained in first integrated connector 105. However, because the choke may be external to first integrated connector 105, consistent with embodiments of the disclosure, vertical space 335 may be eliminated to, for example, give connector structure 300 a lower profile on circuit board 130.

Figure 4:
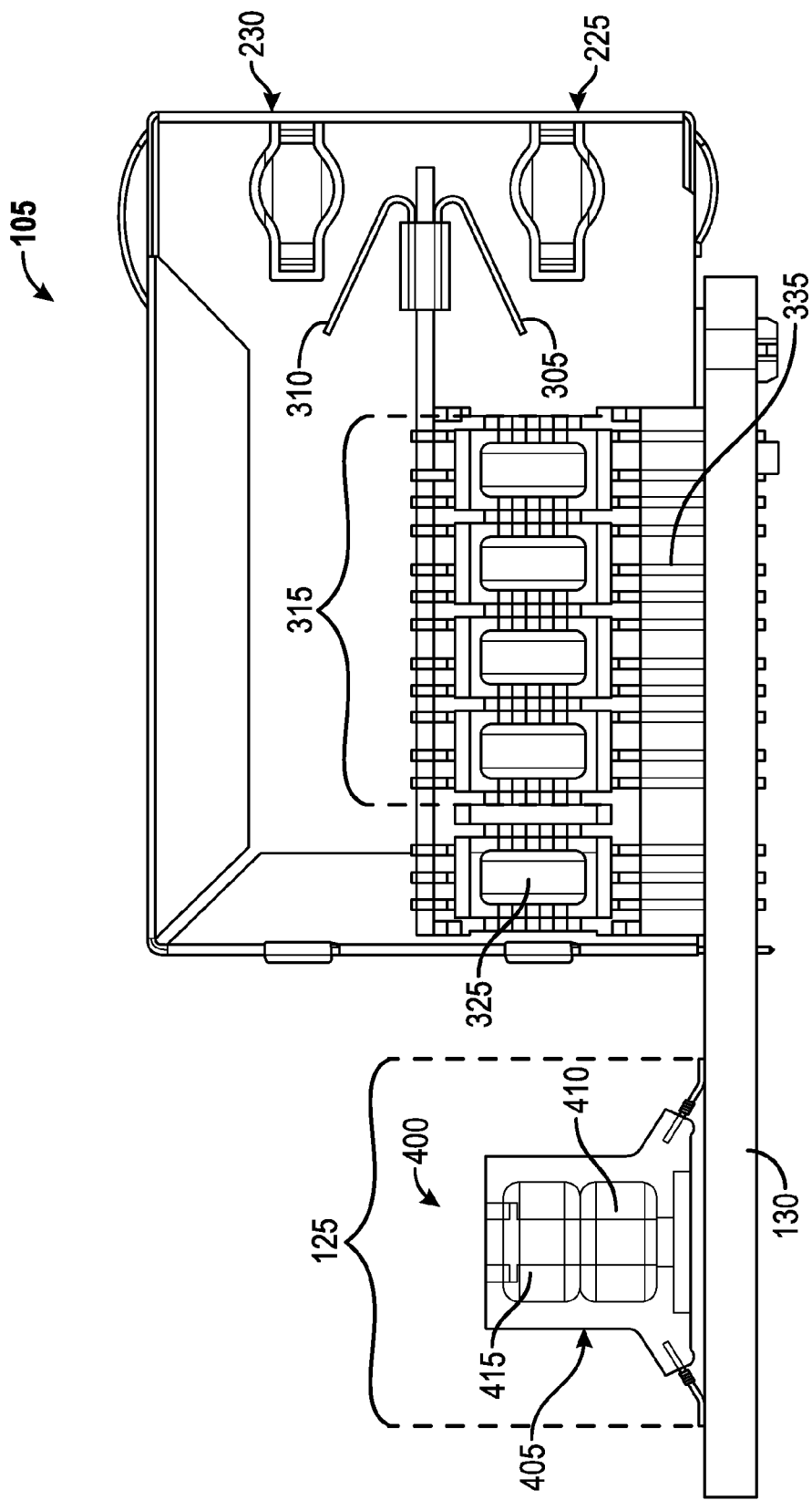
FIG. 4 shows a choke structure.

FIG. 4 shows a choke structure 400. As shown in FIG. 4, choke structure 400 may comprise a choke 405 that may comprise a first choke coil 410 and a second choke coil 415. First choke coil 410 and second choke coil 415 may be configured for high electrical performance with toroidal ferrites for example.

While choke 405 is shown to include two coils (e.g. first choke coil 410 and second choke coil 415) choke 405 is not so limited and may include any number of coils. For example, the ratio of choke coils to transformers may be 1:2 as shown in FIG. 4 or may comprise any ratio (e.g. 1:1.) Choke structure 400 may be located in choke structure space 125 or in any location on circuit board 130. Choke 405 may correspond to first receptacle 225 and may be electrically connected to first plurality of transformers 315 through circuit board 130. Other chokes may be included on circuit board 130 and may correspond to other receptacles in first integrated connector 105 in a similar fashion.

Choke 405 may comprise a common-mode choke. A common-mode choke may comprise two coils that may be wound on a single core (e.g. first choke coil 410 or second choke coil 415) and may be useful for EMI and Radio Frequency interference (RFI) prevention from, for example, power supply lines and other sources. A common-mode choke may pass differential currents (e.g. equal but opposite), while blocking common-mode currents.

Choke 405 may be configured and tuned to filter noise caused by other components in device 100. For example, components that may cause noise to be filtered by choke 405 may comprise, but are not limited to, power supply 135, first DC-to-DC converter 150, second DC-to-DC converter 155, and a third DC-to-DC converter 160.

One example of device 100's design change over time may be to include different chips for first ASIC 140 and/or second ASIC 145 that may operate a different voltage levels. These changes in first ASIC 140 and/or second ASIC 145 may precipitate corresponding changes, for example, in power supply 135, first DC-to-DC converter 150, second DC-to-DC converter 155, and a third DC-to-DC converter 160 (e.g. the noise causing components.) Because the noise causing components may change as device 100's design is developed and refined over the lifecycle of the device, each newly developed and refined device design may have a correspondingly different noise profile. Consequently, each newly developed and refined device design may have correspondingly different choke sizes in order to mitigate the correspondingly different noise profiles. Consequently, because choke 405 is external to first integrated connector 105, no change may need to be made to first integrated connector 105. Rather choke 405 in choke space 125 may be resized in subsequent design changes over the lifecycle of device 100.

Because the sizes of plurality of transformed 315 may be a function of first PHY circuit 165, the sizes on plurality of transformed 315 may not need to be changed when, for example, first ASIC 140 and/or second ASIC 145 are changed as described above. This may result in a cost savings by avoiding a retooling cost for making a design modified integrated connector 105 because integrated connector 105's design may remain unchanged when device 100's noise profile changes over the lifecycle of the device.

In sum, embodiments of the disclosure may separate a choke from a transformer of an integrated connector. The choke may be removed from the integrated connector. As such, additional pins may be added to the integrated connector to electrically connect the transformer to the now external choke structure that may reside on a circuit board. The breaking apart of the two functions (e.g. transformer and choke) may allow each to be tuned separately. Standardization of the integrated connector transformer may be easier as it is may be optimized for the PHY driver structure (e.g. current mode vs. voltage mode.) The choke can then be optimized independently of the standardized transformer as it may be a function of system level common mode noise levels generated by, for example, AC-to-DC power supplies, DC-to-DC power supplies, and chip internal PLL's.

Embodiments of the disclosure may result in removing the connection between the choke and transformer that resulted in pigtails (or continuous core winding) and now places the connection onto the circuit board where it can be made by circuit board traces in high volume automation for example. The simplification of the separated choke and transformer may allow manual winding to be easier and may remove the pigtail connections that may not be within the capability of automation.

By removing the choke from the integrated connector and placing it on the circuit board: i) a standardized integrated connector transformer may result that can be used in many products and be tooled for high volume; and ii) a choke structure may result that can be optimized for each product. This division of transformer and choke may allow management of automation of these two functions separately as they may have different electrical functions driving them.

Figure 5:
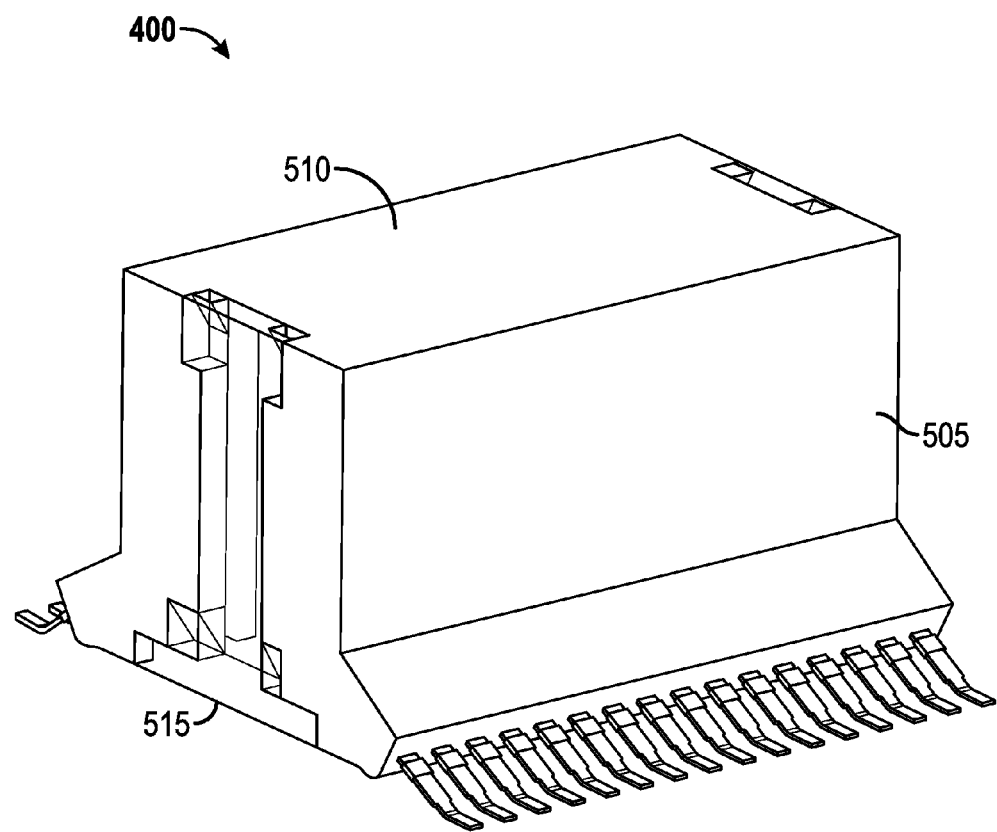
FIG. 5 shows a choke structure.

FIG. 5 shows choke structure 400 in more detail. As shown in FIG. 5, choke structure 400 may comprise a housing 505 including a top surface 510. Housing 505 may comprise a plastic polymer material. A cover 515 may snap in housing 505 from the bottom retaining and enclosing magnetics (e.g. first choke coil 410 and second choke coil 415) in position. Top surface 510 may be, for example, flat to allow for easier installation in choke structure space 125 on circuit board 130 by a pick and place machine for example.

Figure 6:
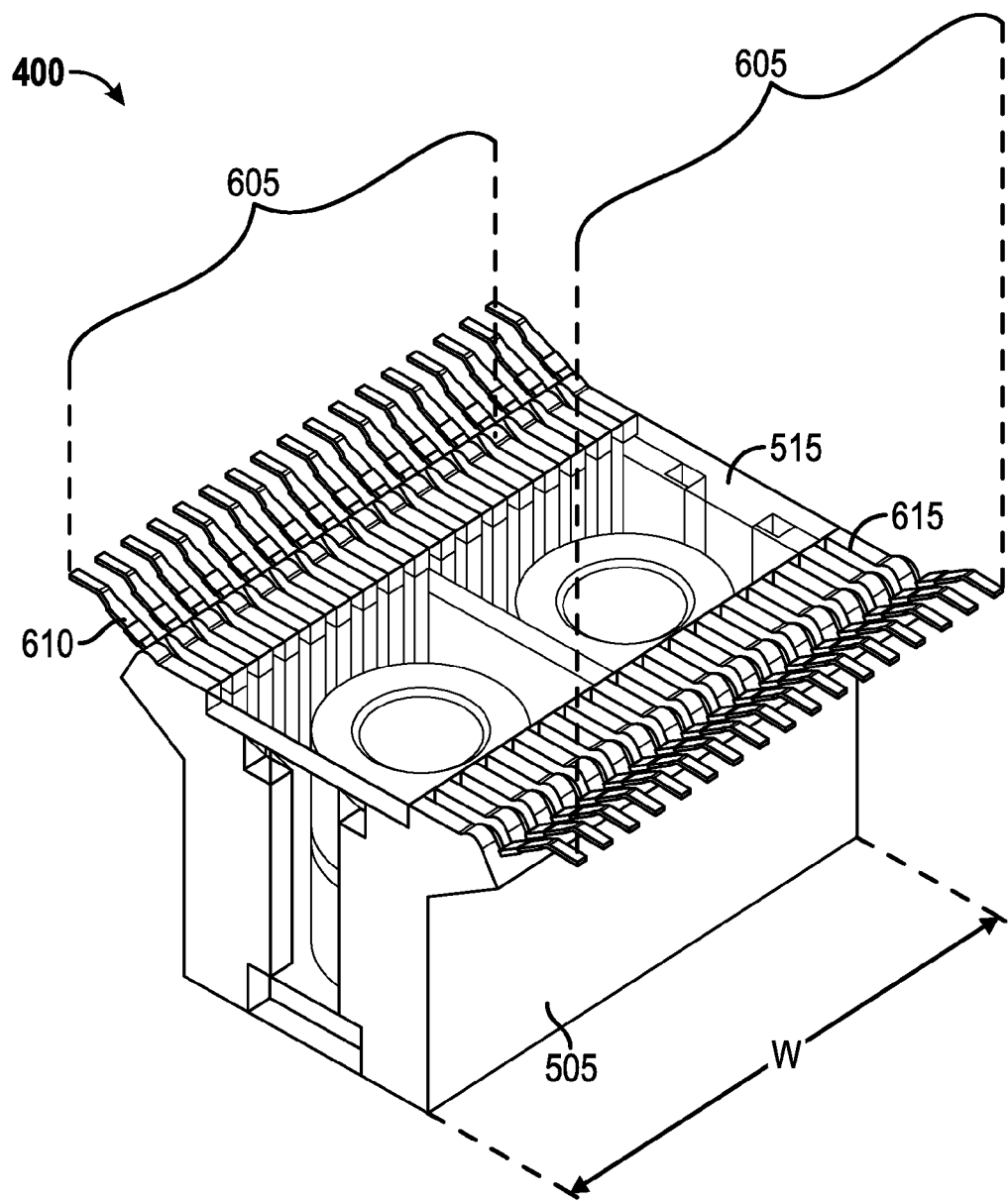
FIG. 6 shows a choke structure.

FIG. 6 shows choke structure 400 in more detail. As shown in FIG. 6, choke structure 400 may comprise a plurality of pins 605 on which a plurality of wires 610 from choke 405 (e.g. first choke coil 410 and second choke coil 415) may be terminated. Plurality of wires 610 may be terminated external to housing 505 or internal to housing 505. One or multiple wires of plurality of wires 610 may be terminated on one of plurality of pins 605. Housing 505 may accommodate a two wire toroidal choke design, however, it is not so limited and may also accommodate alternative choke designs and other forms of ferrites.

Choke structure 400 may also include a plurality of wire routing paths 615 in which the plurality of wires may be routed for their protection. Plurality of pins 605 may comprise SMT component leads. Plurality of pins 605 may comprise a straight lead design for stitch process and minimal forming. This may allow plurality of wires 610 to be wrapped around preformed pins (e.g. plurality of pins 605.) This may also allow shortest possible lengths to ease wrapping and allow for insert molding. Width W of housing 505 may be configured, for example, to allow housing 505 to fit within a 0.550 inch pitch of an RJ45.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
   a circuit board;
   an integrated connector having a plurality of receptacles comprising at least a first receptacle and a second receptacle, the integrated connector being mounted to the circuit board and having a Faraday cage, the integrated connector comprising a first plurality of transformers and a second plurality of transformers, the first plurality of transformers being connected to the first receptacle and the Faraday cage to block ground currents corresponding to the first receptacle and the second plurality of transformers being connected to the second receptacle and the Faraday cage to block ground currents corresponding to the second receptacle, the plurality of receptacles, the first plurality of transformers, and the second plurality of transformers being surrounded by the Faraday cage;
   a choke structure external to the integrated connector and mounted to the circuit board;
   noise causing components mounted to the circuit board, the noise causing components being outside the integrated connector and outside the choke structure, the noise causing components having a ground in common with the Faraday cage;
   a first choke enclosed within the choke structure, the first choke being electrically connected to the first plurality of transformers and the first receptacle through the circuit board, the first choke having the capacity to filter noise on the first receptacle caused by the noise causing components; and a second choke enclosed within the choke structure, the second choke being electrically connected to the second plurality of transformers and the second receptacle through the circuit board, the second choke having the capacity to filter noise on the second receptacle caused by the noise causing components.

2. The apparatus of claim 1, wherein the first choke comprises at least two choke coils.

3. The apparatus of claim 1, wherein the integrated connector comprises at least one Power-over-Ethernet (POE) transformer.

4. The apparatus of claim 1, wherein the noise causing components of the apparatus comprise a direct current (DC) to (DC) converter.

5. The apparatus of claim 1, wherein the first choke is configured for high electrical performance with toroidal ferrites.

6. The apparatus of claim 1, wherein the apparatus comprises a networking device.

7. The apparatus of claim 6, wherein the networking device comprises one of the following: a network switch and a router.

8. The apparatus of claim 1, further comprising a partition disposed between the first choke and the second choke in the choke structure and wherein the first choke comprises two choke coils stacked in the choke structure and the second choke comprises two choke coils stacked in the choke structure.

9. The apparatus of claim 1, wherein the noise causing components comprise a power supply.

10. The apparatus of claim 9, wherein the power supply supplies power to elements on the circuit board that are within the Faraday cage and to elements on the circuit board that are external to the Friday cage.

11. An apparatus comprising:
a circuit board;
an integrated connector having a plurality of receptacles comprising at least a first receptacle and a second receptacle, the integrated connector being mounted to the circuit board and having a Faraday cage, the integrated connector comprising a first transformer and a second transformer, the first transformer being connected to the first receptacle and the Faraday cage to block ground currents corresponding to the first receptacle and the second transformer being connected to the second receptacle and the Faraday cage to block ground currents corresponding to the second receptacle, the plurality of receptacles, the first transformer, and the second transformer being surrounded by the Faraday cage;
a choke structure external to the integrated connector and mounted to the circuit board;
a noise causing component mounted to the circuit board, the noise causing component being outside the integrated connector and outside the choke structure, the noise causing component having a ground in common with the Faraday cage;
a first choke enclosed within the choke structure, the first choke being electrically connected to the first transformer and the first receptacle through the circuit board, the first choke having the capacity to filter noise on the first receptacle caused by the noise causing component; and
a second choke enclosed within the choke structure, the second choke being electrically connected to the second transformer and the second receptacle through the circuit board, the second choke having the capacity to filter noise on the second receptacle caused by the noise causing component.

12. The apparatus of claim 11, wherein the first choke comprises at least two choke coils.

13. The apparatus of claim 11, wherein the integrated connector comprises at least one Power-over-Ethernet (POE) transformer.

14. The apparatus of claim 11, wherein the first choke is configured for high electrical performance with toroidal ferrites.

15. The apparatus of claim 11, wherein the apparatus comprises a networking device.

16. The apparatus of claim 15, wherein the networking device comprises one of the following: a network switch and a router.

17. The apparatus of claim 11, further comprising a partition disposed between the first choke and the second choke in the choke structure and wherein the first choke comprises two choke coils stacked in the choke structure and the second choke comprises two choke coils stacked in the choke structure.

18. The apparatus of claim 11, wherein the noise causing component comprises a power supply.

19. The apparatus of claim 18, wherein the power supply supplies power to elements on the circuit board that are within the Faraday cage and to elements on the circuit board that are external to the Friday cage.

20. The apparatus of claim 11, wherein the noise causing component comprises a direct current (DC) to (DC) converter.

* * * * *